US009778828B2

(12) United States Patent
Nicol et al.

(10) Patent No.: US 9,778,828 B2
(45) Date of Patent: *Oct. 3, 2017

(54) PRESENTING OBJECT PROPERTIES

(71) Applicant: Autodesk, Inc., San Rafael, CA (US)

(72) Inventors: Todd Christopher Nicol, Warren, MI (US); Jeff Maisano, Novi, MI (US); Josh Dagg, Redford, MI (US)

(73) Assignee: Autodesk, Inc., San Rafael, CA (US)

( * ) Notice: Subject to any disclaimer, the term of this patent is extended or adjusted under 35 U.S.C. 154(b) by 546 days.

This patent is subject to a terminal disclaimer.

(21) Appl. No.: 14/510,966

(22) Filed: Oct. 9, 2014

(65) Prior Publication Data
US 2015/0033166 A1 Jan. 29, 2015

Related U.S. Application Data

(63) Continuation of application No. 13/037,769, filed on Mar. 1, 2011, now Pat. No. 8,863,032.

(60) Provisional application No. 61/309,288, filed on Mar. 1, 2010.

(51) Int. Cl.
G06F 3/048 (2013.01)
G06F 3/0484 (2013.01)
G06F 3/0482 (2013.01)
G06F 3/0483 (2013.01)
G06F 3/0481 (2013.01)
G06F 17/50 (2006.01)

(52) U.S. Cl.
CPC ........ *G06F 3/04842* (2013.01); *G06F 3/0482* (2013.01); *G06F 3/0483* (2013.01); *G06F 3/04817* (2013.01); *G06F 3/04847* (2013.01); *G06F 17/50* (2013.01)

(58) Field of Classification Search
CPC ... G06F 3/04817; G06F 17/50; G06F 3/04842
See application file for complete search history.

(56) References Cited

U.S. PATENT DOCUMENTS

| 6,448,987 | B1 | 9/2002 | Easty et al. |
| 8,177,551 | B2 | 5/2012 | Sachdeva et al. |
| 8,863,032 | B2 | 10/2014 | Nicol et al. |
| 2005/0257157 | A1 | 11/2005 | Gilboa et al. |
| 2007/0099147 | A1 | 5/2007 | Sachdeva et al. |

(Continued)

OTHER PUBLICATIONS

*How to Get Album Artwork for an iPod or iTunes*, WikiHow, published Apr. 10, 2008. 5 pages.

*Primary Examiner* — William Bashore
*Assistant Examiner* — Rayeez Chowdhury
(74) *Attorney, Agent, or Firm* — Fish & Richardson P.C.

(57) ABSTRACT

The present disclosure includes, among other things, systems, methods and program products for presenting object properties by receiving selection of a component of a model presented in a graphical user interface (GUI) of a computer aided design tool, the GUI including an interactive display element having an arrangement of property fields related to the selected component, determining property values associated with the property fields based on the selected component, and providing the determined property values in corresponding property fields of the interactive display element for presentation in the GUI in conjunction with the model, such that responsive to receiving selection of a different component of the model, the property fields are updated with property values corresponding to the different component.

19 Claims, 19 Drawing Sheets

(56) References Cited

U.S. PATENT DOCUMENTS

| | | |
|---|---|---|
| 2007/0179976 A1 | 8/2007 | Arvin et al. |
| 2008/0140357 A1 | 6/2008 | Bussey et al. |
| 2008/0188969 A1 | 8/2008 | O'Malley et al. |
| 2009/0089692 A1 | 4/2009 | Morris |
| 2009/0216502 A1 | 8/2009 | Booth |
| 2009/0226080 A1 | 9/2009 | Boyd et al. |
| 2010/0268513 A1 | 10/2010 | Loberg |

PRESENTING OBJECT PROPERTIES

CROSS-REFERENCE TO RELATED APPLICATIONS

This application is a continuation of and claims priority under 35 U.S.C. §120 to U.S. patent application Ser. No. 13/037,769, filed Mar. 1, 2011, which is a non-provisional of and claims priority under 35 U.S.C. §119 to U.S. Provisional Application Ser. No. 61/309,288, filed on Mar. 1, 2010, both of which are incorporated by reference herein.

TECHNICAL FIELD

This disclosure relates generally to user interfaces for computer-implemented systems, and more particularly, to displaying object properties in an interactive user interface of a software environment.

BACKGROUND

Computer programs often use a graphical user interface (GUI) to display graphical representations of electronic documents, images, text, etc. For example, in a CAD environment, a GUI may be used to display complex assemblies having multiple components or objects. Each object may have one or more properties associated with it, including, for example, properties related to the object's name, size, color, thickness, appearance, creator, state, approving manager, etc. Some objects may undergo numerous design changes or revisions during product development.

SUMMARY

In general, one aspect of the subject matter described in this specification can be embodied in a method that includes receiving selection of a component of a model presented in a graphical user interface (GUI) of a computer aided design tool, the GUI including an interactive display element having an arrangement of property fields related to the selected component, determining property values associated with the property fields based on the selected component, and providing the determined property values in corresponding property fields of the interactive display element for presentation in the GUI in conjunction with the model, such that responsive to receiving selection of a different component of the model, the property fields are updated with property values corresponding to the different component. Other embodiments of this aspect include corresponding systems, apparatus, and computer program products.

These and other embodiments can each optionally include one or more of the following features. Receiving selection of the component can include receiving selection of multiple components. Providing the determined property values can include providing a predetermined property value (e.g., "varies") in the corresponding property field if property values associated with the property field differ between the multiple components. The property fields can include an image field and the determined property values can include a thumbnail image. Providing the determined property values can include providing thumbnail images of the multiple components in the image field for presentation in the GUI. The embodiments can include receiving a replacement property value for a selected property field in the interactive display element, and updating a same property value of each of the multiple components based on the replacement property value. The determined property values can be a first set of property values, such that the interactive display element is operable to select a revision of the selected component, and such that the embodiments further include receiving input indicating selection of a different revision of the selected component in the interactive display element, and responsive to the input determining a second set of property values based on the different revision of the selected component, and providing the second set of property values in corresponding property fields of the interactive display element for presentation in the GUI in conjunction with the model. The different revision of the selected component can be a previous revision, such that providing the second set of property values can include highlighting display fields having a different property value than a property value of a recent revision of the selected component. Embodiments may further include receiving input from the interactive display element indicating the property value of the recent revision of the selected component is to be set to the different property value. The interactive display element can include a slide bar operable to select the revision of the selected component. Further, the interactive display element can be operable to select a display mode, such that embodiments further include receiving input indicating selection of a first display mode of the interactive display element, and responsive to the input, providing information related to one or more additional components for simultaneous presentation in the GUI in conjunction with the model. Providing information can include determining a set of property values for each of the one or more additional components and providing at least a portion of each set of property values. The arrangement of property fields can be a data card arrangement, such that providing information can include providing the information for presentation in the GUI as one or more additional data cards corresponding to the one or more additional components, such that the portion of each set of property values is simultaneously displayed. Embodiments may further include receiving a selection of the one or more additional components. The interactive display element can include a foreground display element for presenting property values associated with an active component chosen from the selected component and the one or more additional components. Implementations may also include receiving input from the interactive display element indicating selection of a different active component, and responsive to the input, providing property values associated with the different active component for presentation in the foreground display element. The selected component and the one or more additional components can be presented in a circular list, such that the input indicating selection of the different active component further indicates whether the different active component selected is before or after the active component in the circular list.

Particular embodiments of the subject matter described in this specification can be implemented to realize one or more of the following advantages. Data cards providing property information and/or revision information related to components of an assembly may be made more relevant when shown in the context of the assembly, thus helping to eliminate the potential confusion and uncertainty associated with using and/or switching between two different processes/applications to review/edit information. The tools and techniques disclosed herein may also enable a user to quickly find needed components and to make appropriate edits while avoiding costly mistakes along the way.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
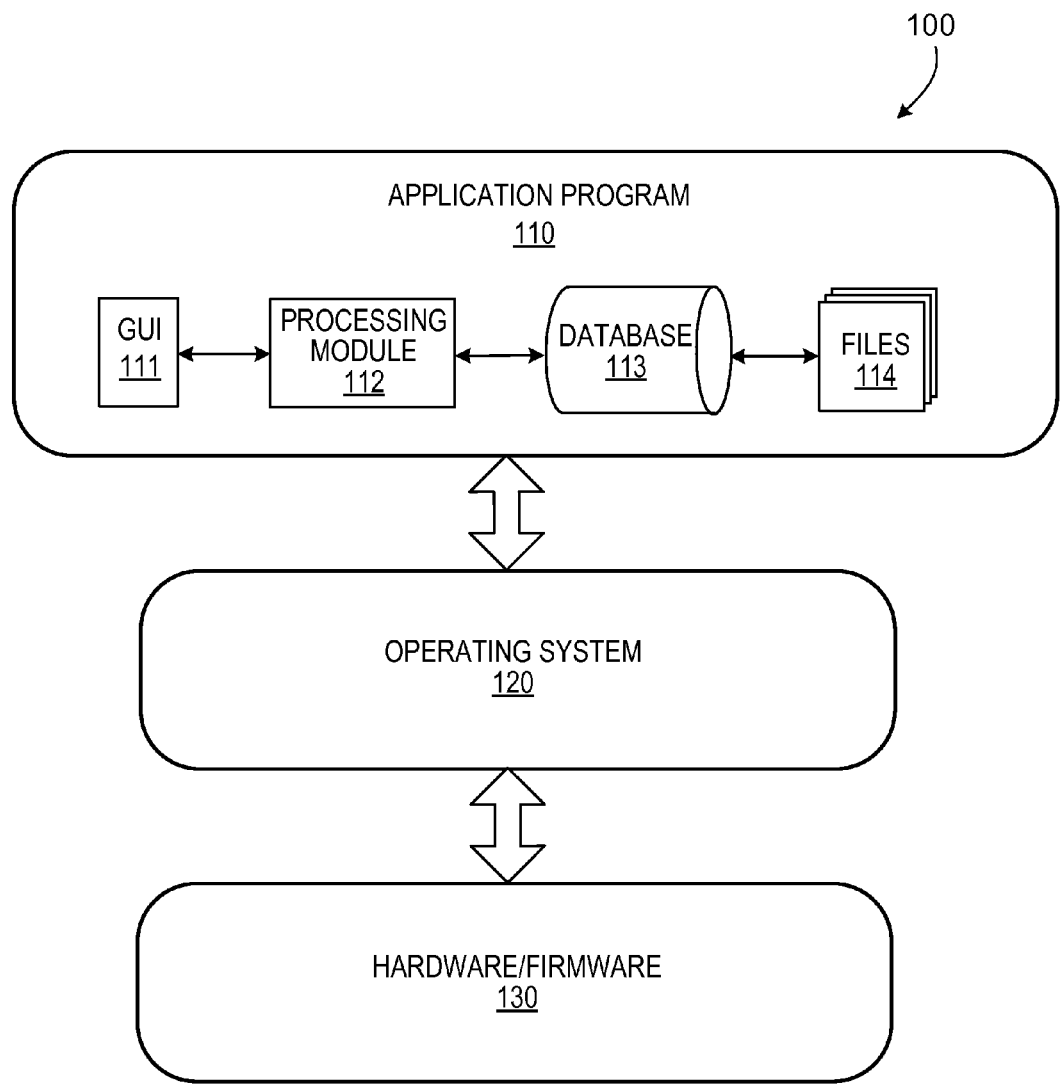
FIG. 1 is a block diagram illustrating an exemplar computing system 100.

FIG. 1 is a block diagram illustrating an exemplar computing system 100 configured to perform the techniques described herein. The components include an application program 110, an operating system 120, and hardware/firmware devices 130. Application program 110 includes GUI 111, processing module 112, and database 113 for storing data (e.g., electronic documents, tables, structures, etc.) in one or more files 114. GUI 111 presents information to a user and provides functionality for the user's interaction with application program 110. Processing module 112 processes input received from GUI 111 and/or operating system 120, retrieves, processes, and stores data in files 114, and delivers processed results to GUI 111 for presentation to the user.

Figure 2A:
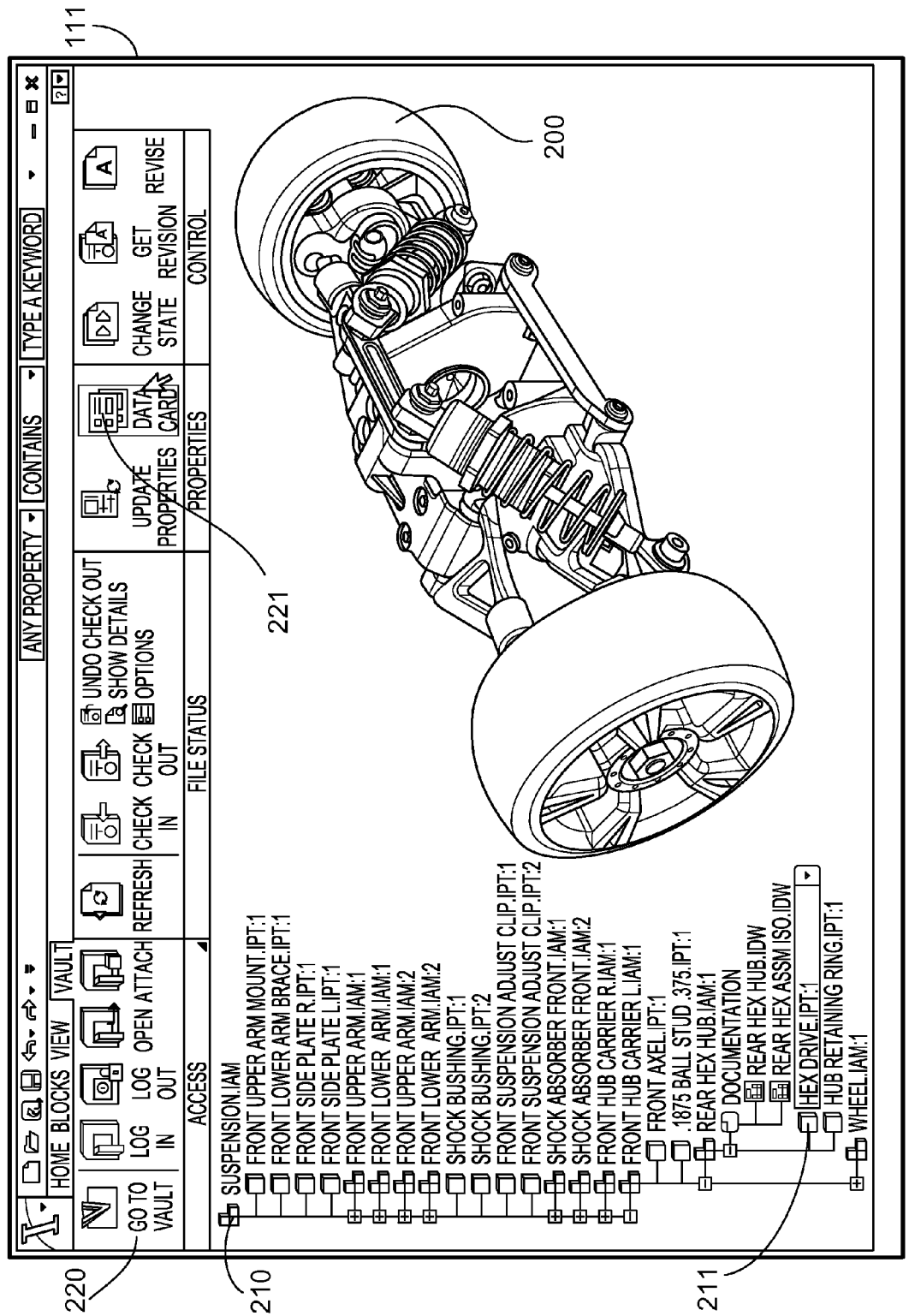
FIG. 2A is an exemplar graphical user interface presenting a 3-D model and a hierarchical list of included components.

FIG. 2A illustrates a graphical user interface 111 for viewing and manipulating one or more CAD models. The user interface 111 can be presented by an interactive CAD program or tool that allows for the viewing, creating, and modifying of one or more CAD models. Generally speaking, a CAD model (or "model") contains information required to represent one or more physical and analytical elements, and relationships between them, load information, and result information. For example, a CAD model can store one or more representations of a CAD model of a building, a circuit, a mechanical assembly, a communication network, a computer database system, a distributed processing system, etc. A CAD model can be stored in one or more files, object-oriented databases, relational databases, distributed objects, caches, data structures, combinations of these, or other suitable storage. The term "components" as used herein is synonymous with the CAD model's contents and includes CAD models.

In FIG. 2A, GUI 111 presents a model 200 of a product assembly and a browser 210 including a hierarchically formatted list of included components. As illustrated, the selection of component 211 is indicated by highlighted text in browser 210. GUI 111 also presents an application ribbon 220 including a command 221 for invoking an interactive display element 230, for example, a data card user interface. In some implementations, interactive display element 230 is invoked by an event such as, for example, a key stroke, a combination of keys, a gesture, a mouse click, a verbal command, etc.

Figure 2B:
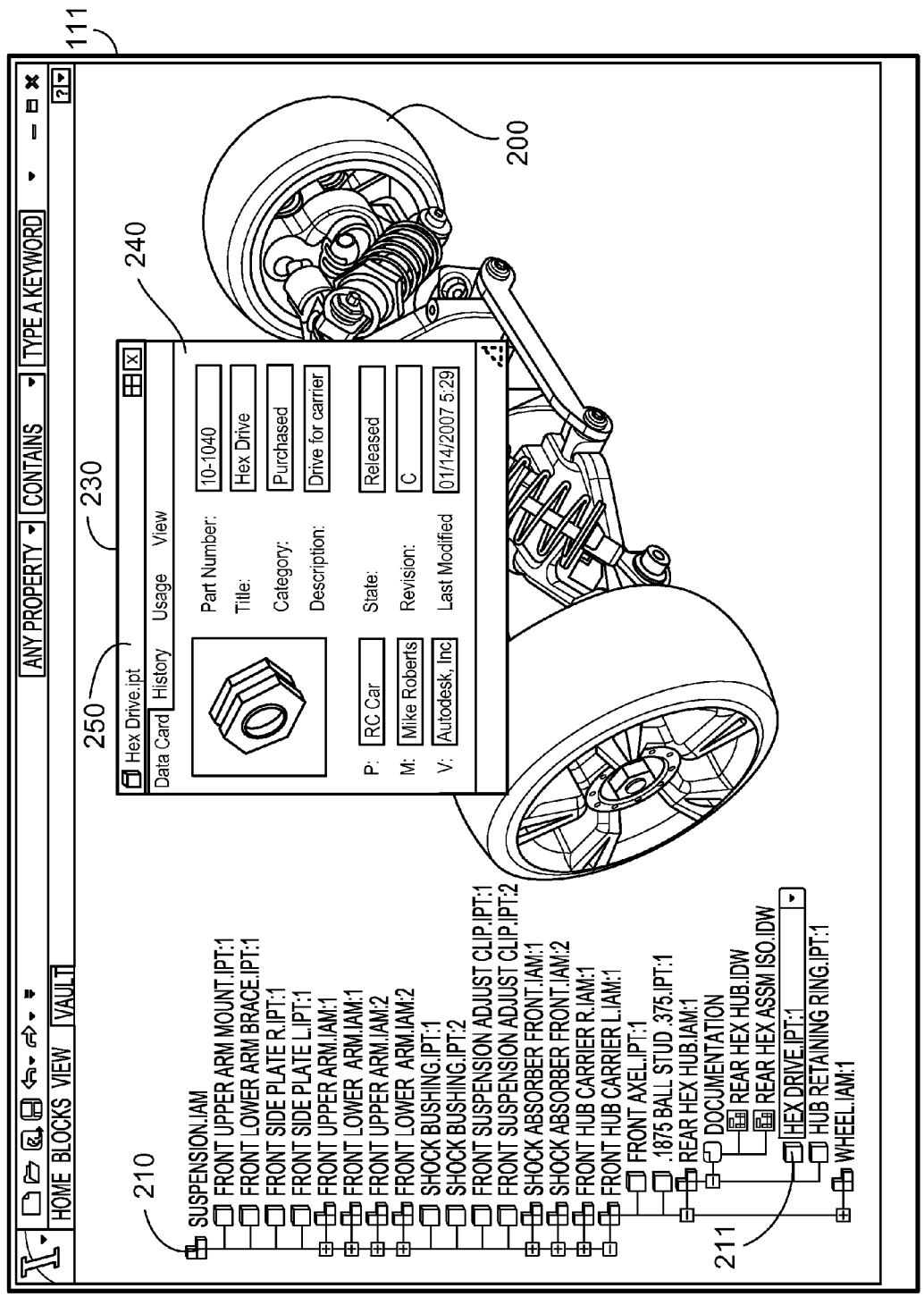
FIG. 2B illustrates an exemplar interactive display element in a graphical user interface.

As illustrated in FIG. 2B, interactive display element 230 presents a component data card 240 including property information corresponding to selected component 211 within GUI 111. Interactive display element 230 retrieves data about a particular component from a database (e.g., database 113) and presents that data within the CAD environment. Presenting interactive display element 230 within the CAD environment, or another suitable environment, provides the user an opportunity to reference the model as each component data card is examined. In some implementations, the data card layout is customizable to include properties such as revision state, part name, part number, etc., organized by tab to provide the user with finger tip access to relevant component metadata without leaving the CAD environment. The interface can be repositioned within GUI 111, for example, by clicking on title bar 250 with a mouse or other pointing device and dragging the interface to the desired location. In some implementations, model 200 may be resized and/or repositioned with respect to interactive display element 230 to facilitate simultaneous viewing of model 200 and data card 240.

In this way, property information associated with selected component 211 is presented in the context of model 200 and browser 210. Each data card 240 represents a single component in model 200. As the user selects different components in model 200 or in browser 210, the property information displayed in interactive display element 230 (i.e., the data card) changes to reflect the property values associated with the currently selected component.

Figure 3A:
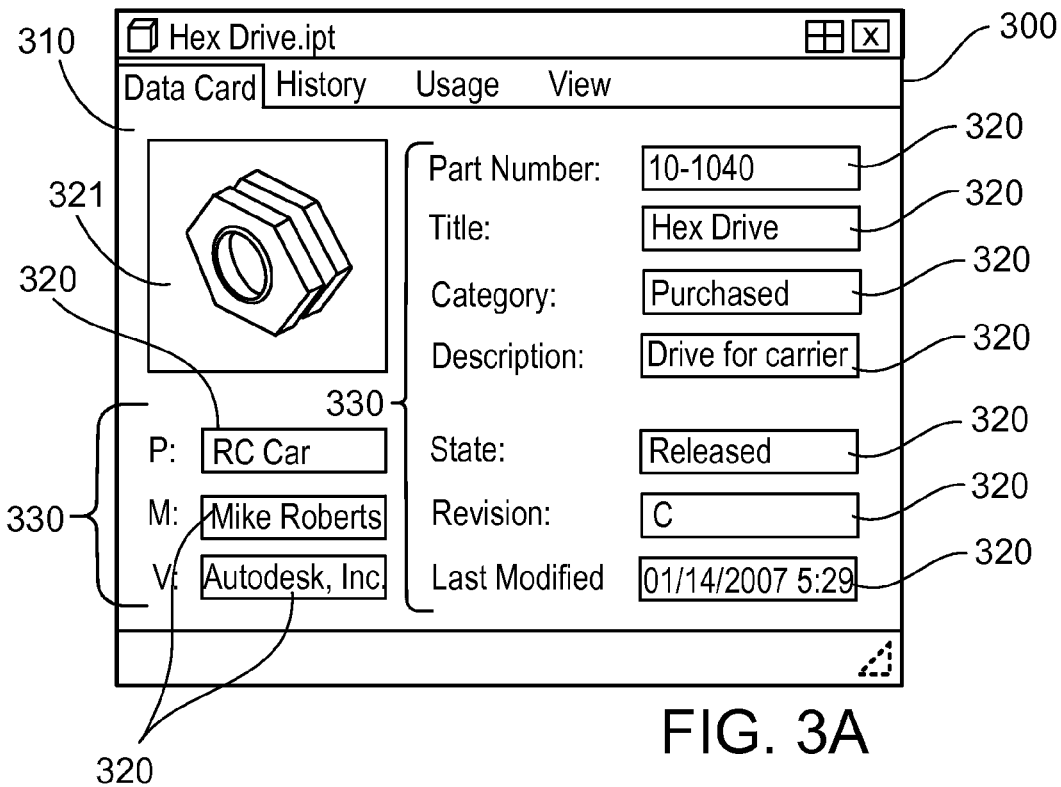
FIGS. 3A, 3B, 3C, and 3D illustrate an interactive display element presenting exemplar data card arrangements having multiple property fields.

FIG. 3A illustrates an exemplar interactive display element 300 presenting component data card 310. Component data card 310 includes an arrangement of property fields 320 and property field labels 330. In this example, property field labels 330 include Part Number, Title, Category, Description, State, Revision, Last Modified, Product (P), Manager (M), and Vendor (V). Property values may include text and/or images, e.g., thumbnail image 321.

Figure 3B:
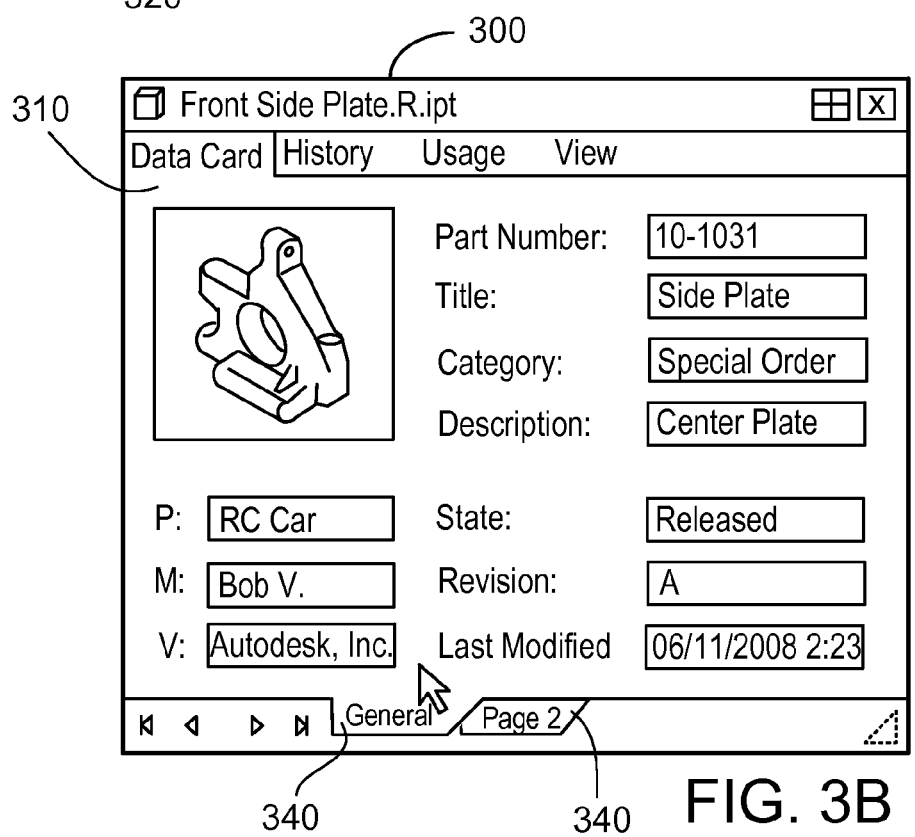
Figure 3C:
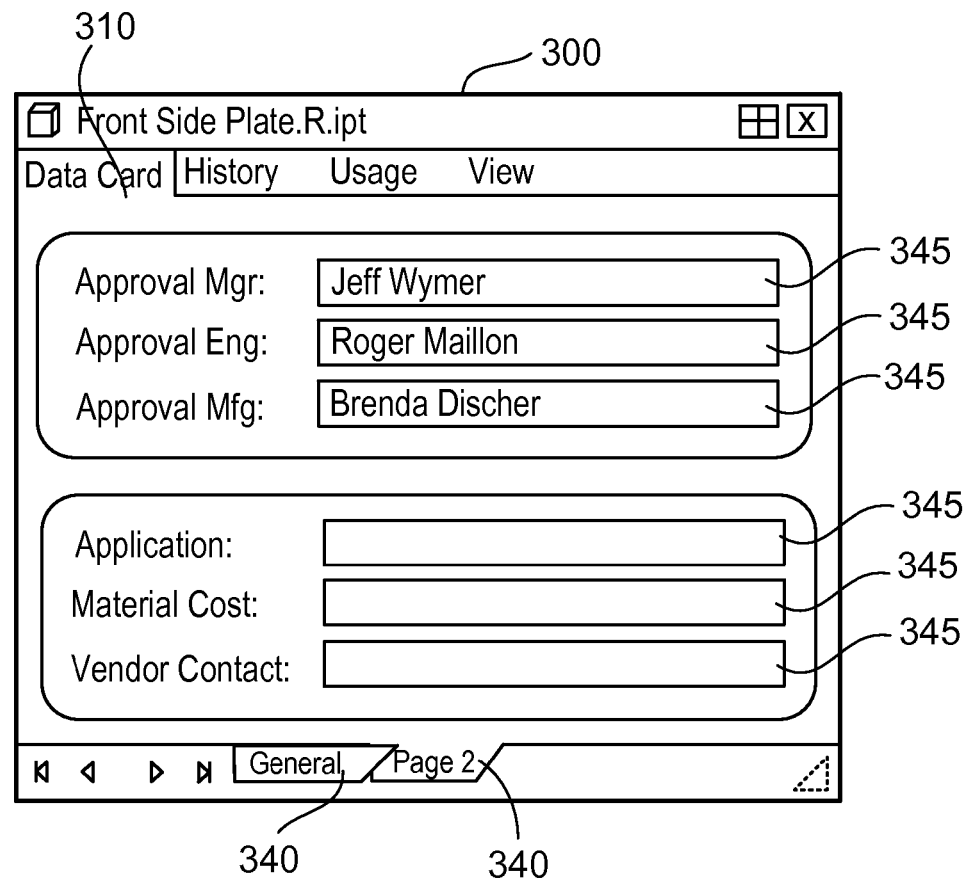
Figure 3D:
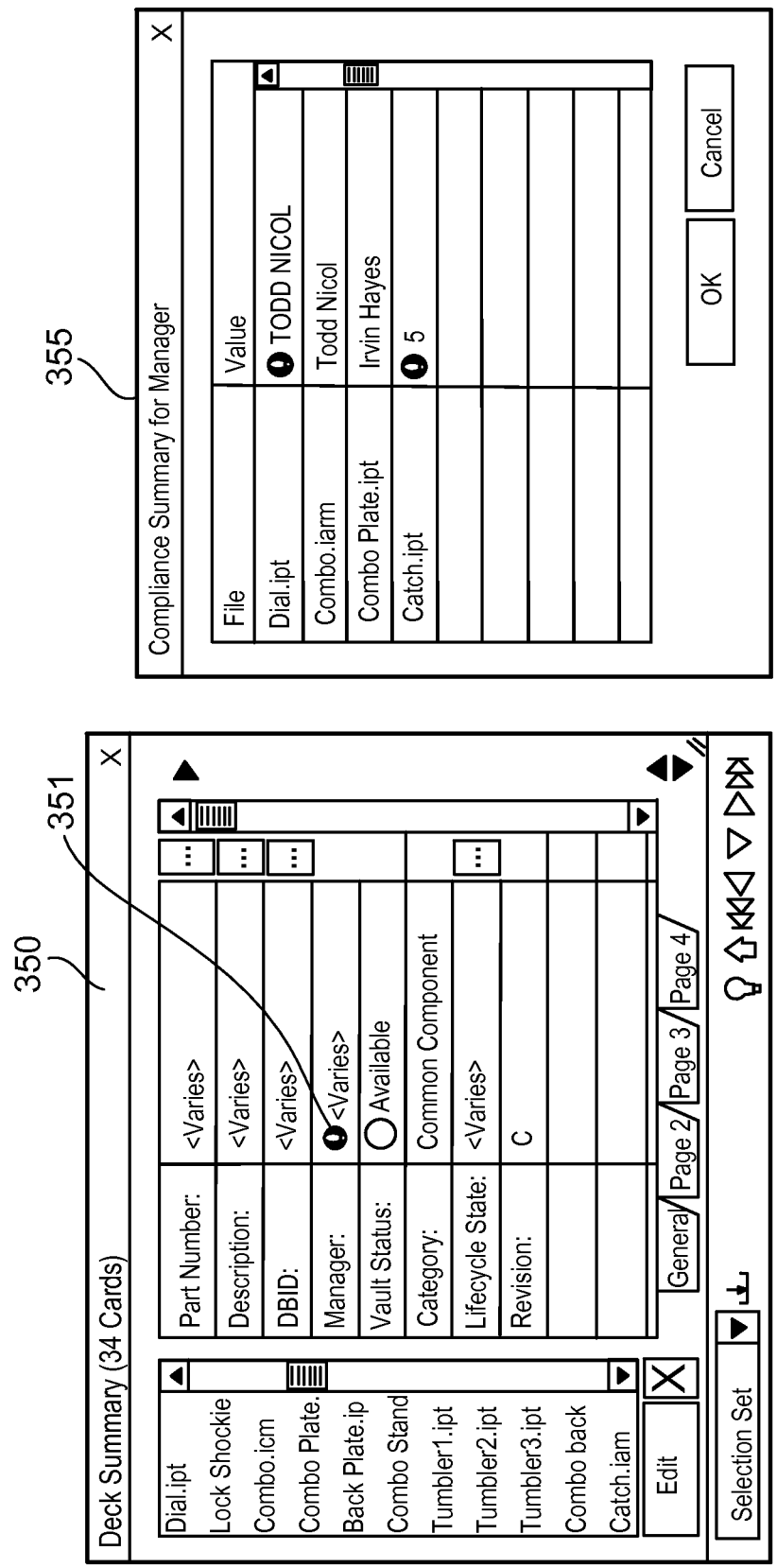

Component data card 310 is customizable to include more or fewer property fields 320 in one or more tabs. Some implementations include data cards having a different number of property fields 320 and/or different types of property fields depending on the type of components included in model 200, and/or the particular component selected for display. For example, FIGS. 3B-3C illustrate a data card having a second tab 340 for presenting additional property fields 345. In further implementations, the data cards include a single set of property fields 320, 345 arranged in a data card. Based on the type of component selected, some property fields may be deactivated (e.g., grayed out, locked, etc.) to indicate the property fields do not pertain to the selected component. In some implementations, a required property value or a non-compliant property value is indicated by highlighting the property field 320 and/or the property field label 330, presenting an image (e.g., a red "bang" icon 351, as illustrated in FIG. 3D) within the property field, and/or presenting a text string (e.g., "N/A," "TBD," "!," etc.) in the property field. A user may right-click on a non-compliant property value to view another perspective of the values for a given property (e.g., a spreadsheet view 355 that breaks down the distributed values by filename/component and property, listing which specific property value is assigned to which component). A user may then use spreadsheet view 355 for a property to manage non-compliant values without leaving a summary data card 350 summarizing selected component data cards 310.

Figure 4:
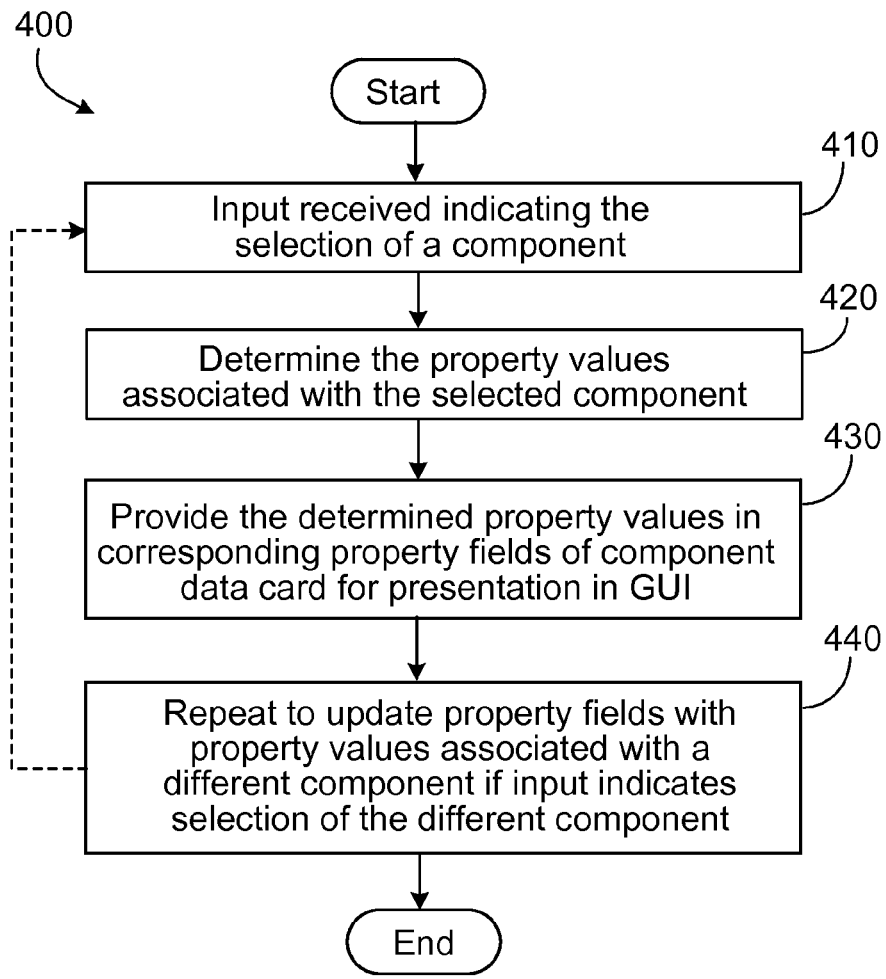
FIG. 4 illustrates an exemplar flow diagram 400 of a technique for presenting component property information within a graphical user interface.

FIG. 4 illustrates an exemplar flow diagram 400 for presenting component property information within GUI 111. After receiving input indicating the selection of a component (410), a processing module (e.g., processing module 120) determines the property values associated with the selected component (420), and provides the determined property values in corresponding property fields of component data card 310 for presentation in GUI 111 (430). If input indicating selection of a different component is received, the process is repeated such that the property fields are updated with property values associated with the different component (440).

Referring again to FIGS. 3A-3C, in some implementations, the property values associated with the selected component can be modified by the user, for example, by clicking on the property field 320 and entering a new property value. In some cases, it may be necessary or beneficial for a user to examine and/or modify property values associated with multiple components, simultaneously. Some implementations facilitate this by enabling the selection of multiple components. Multiple components are selected, for example, by pressing the [CTRL] key while clicking on the components in model 200 or browser 210. In other implementations, components remain selected until deselected, thereby eliminating the need for additional input while selecting multiple components. In still other implementations, multiple components may be selected in response to a query or search for a common property value or characteristic. Certain implementations enable the selection of multiple components using a combination of these techniques and/or other techniques. In some examples, the number of selected components appears at the top of data card 310.

Figure 5A:
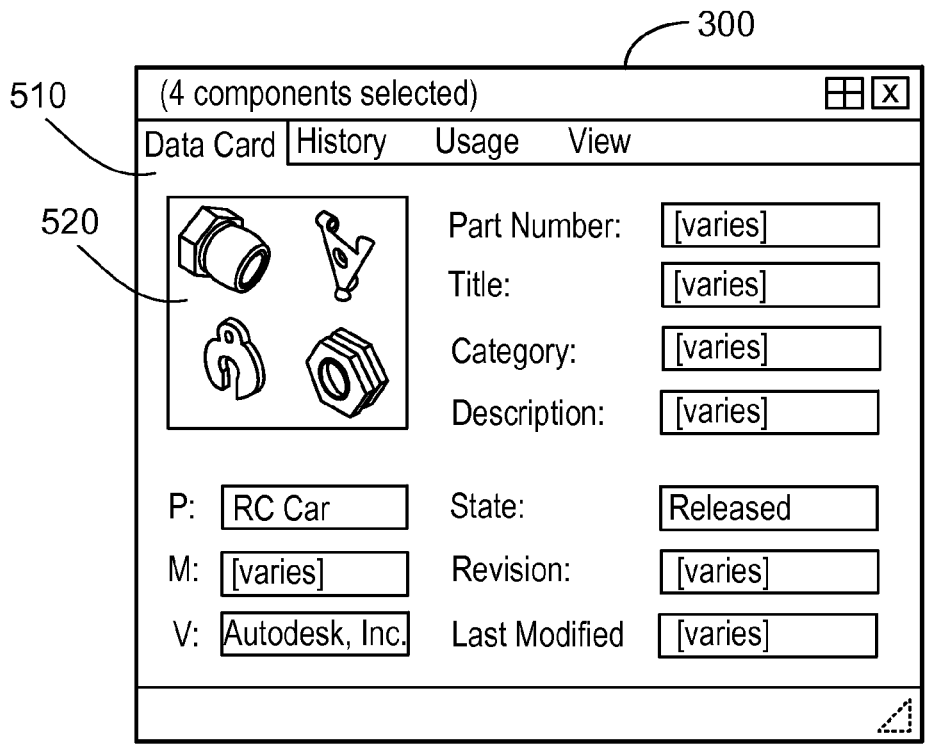
FIGS. 5A, 5B, and 5C illustrate an exemplar data card presenting property information for multiple components.

Referring now to FIG. 5A, in response to receiving input indicating the selection of multiple components, interactive display element 300 displays a data card 510 presenting multiple thumbnail images 520 in the thumbnail property field. The text string "(varies)" is presented in property fields for which the property values associated with the selected components differ. In some implementations, differing property values are indicated by presenting an image or a different text string including numbers, symbols, and/or characters, such as, for example, "N/A," "Differ," "–," "!," "3-values," etc. in the property field. In some implementations, the property field is highlighted to indicate differing property values among the selected components for the corresponding field. As described above, the property values for the selected components may be modified by the user, for example, by entering a new value in the corresponding property field. As a result of this edit, the entered value is applied to each of the selected components.

Figure 5B:
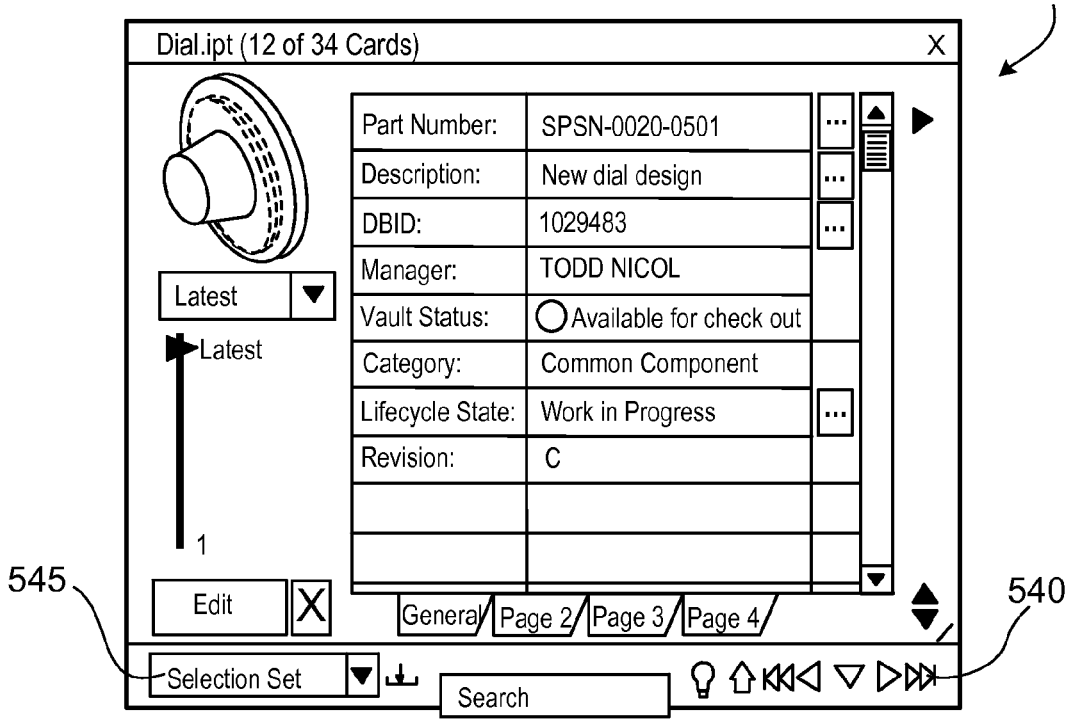

FIG. 5B illustrates an exemplar implementation of a data card deck 530 including a collection of thirty-four data cards. Deck controls 540 provide the user with a quick, easy way to move through the cards in order to review/edit the component properties and/or metadata. Selection interface 545 enables the user to specify the source of the card deck (e.g., a current selection of components, a saved selection of components, etc.) In some implementations, the component data cards in the deck are collected based on part status or another parameter, relative location with respect to a selected component (e.g., adjacent components), individually selected components from browser 210, a previously saved selection, component data cards associated with an assembly or sub-assembly of model 200, etc. Deck controls 540 enable the user to interactively query individual parts in GUI 111 by flipping through the cards like a digital rolodex using a user input device, including, for example, a mouse, keyboard arrow keys, etc. In some implementations, as a data card is moved to the front of the stack, the corresponding component is highlighted in model 200. As described below, some implementations may include a search field operable to identify component data cards matching the search criteria.

Figure 5C:
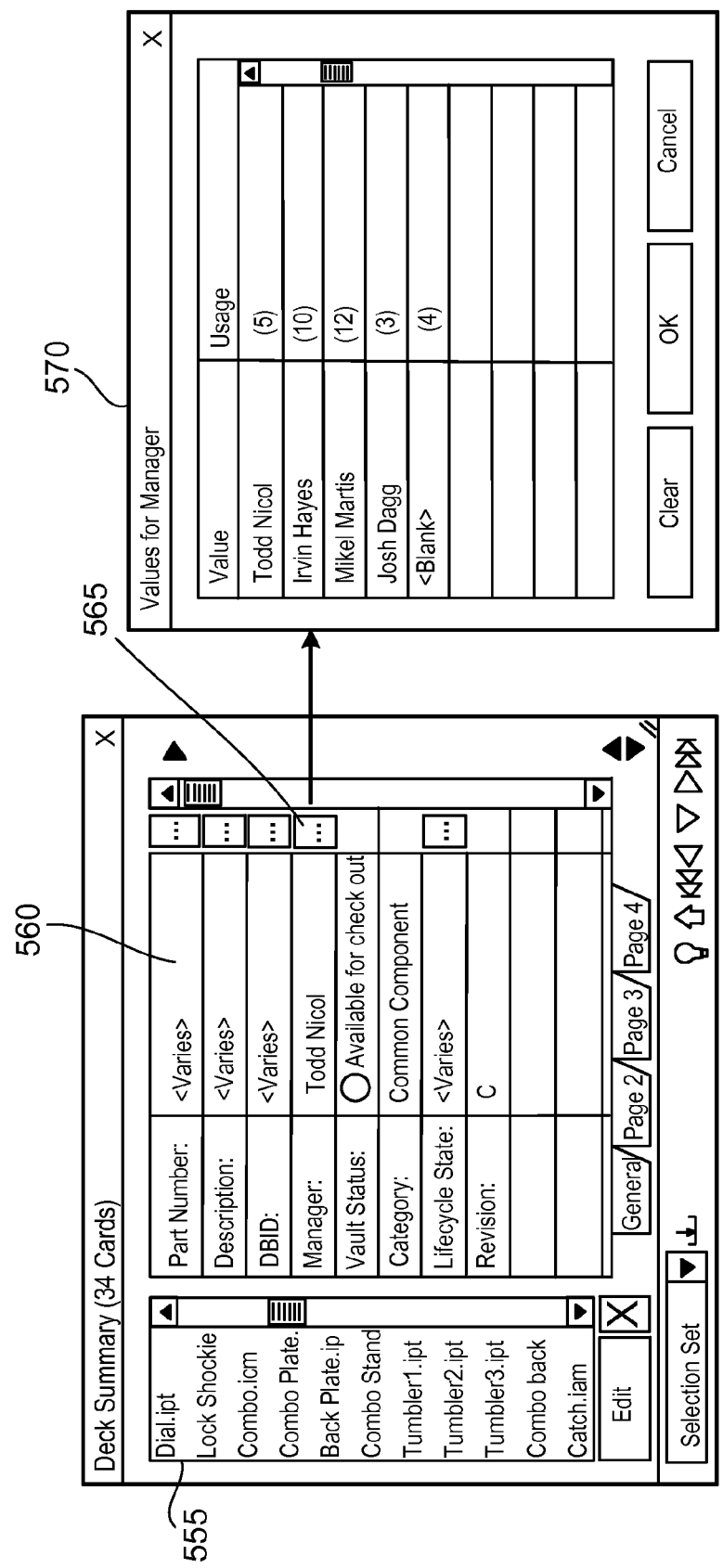

FIG. 5C illustrates an exemplar summary data card 550 ("home card") including a cards list 555 and property summary table 560. Property summary table 560 summarizes the property values for each component data card in card deck 530 and allows for bulk editing of the card deck. As illustrated, card list 555 displays the name of each data card in the deck. If the user selects a card from the list 555, only the values for the selected card are displayed. If the user selects multiple cards from card list 555, the values for the selected cards are summarized in property summary table 560. As described above, where multiple values are used across different cards, a predetermined value (e.g., "varies" or other value as determined by the user, administrator, or programmer determines) is displayed. The user can click expansion button 565 to see the list of values and the number of times a value is used. For example, in FIG. 5C, value collector interface 570 shows the value for property field, "Manager," has the following values through the deck: Josh Dagg—10 times, Todd Nicol—4 times, Irvin Hayes—3 times, and 17 data cards include a blank value. By providing the various values for a property in a single collection, a user may be able to quickly review the value distribution and determine which values need editing. In some implementations, value collector interfaces 570 are available on both summary data card 550 as well as on individual component data cards. On individual component data cards, value collector interface 570 lists each value available for the corresponding property as well as the distribution of each value in the deck such that a user can see immediately how a property value for a particular component compares to the rest of the data card deck.

In some implementations, data card deck 530 includes an edit mode and a read-only mode. In read-only mode, value collector interface 570 enables the user to select cards based on a property value. When the user selects a value from value collector interface 570, only the cards that have that value assigned to that property are selected in cards list 555 and, consequently, summarized in property summary table 560. In the example illustrated in FIG. 5C, only the five corresponding data cards having a Manager value of "Todd Nicol" are highlighted in cards list 555 and summarized in property summary table 560. In some implementations, two or more property fields may have an associated value collector interface 570 operable to select one of a plurality of property values to narrow the card selection as data cards are matched to the multiple selected property values. As a value is set in each value collector interface 570, the selection set is narrowed. In edit mode, summary data card 550 provides a means for bulk editing cards in the data card deck. While in edit mode, a user may select a value from value collector interface 570 to be applied to the entire deck. In some implementations, the user may select whether to apply the value to the entire deck or only the cards selected in cards list 555.

Figure 6A:
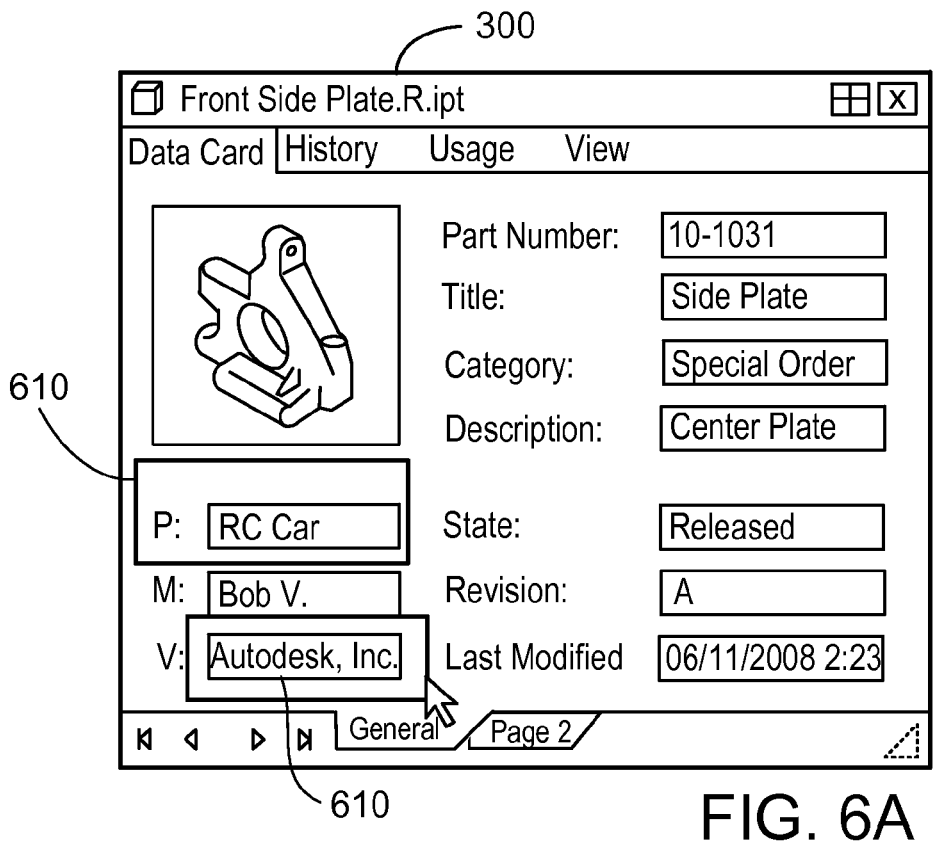
FIGS. 6A, 6B, and 6C illustrate an exemplar technique for selecting multiple property fields in a data card.
Figure 6B:
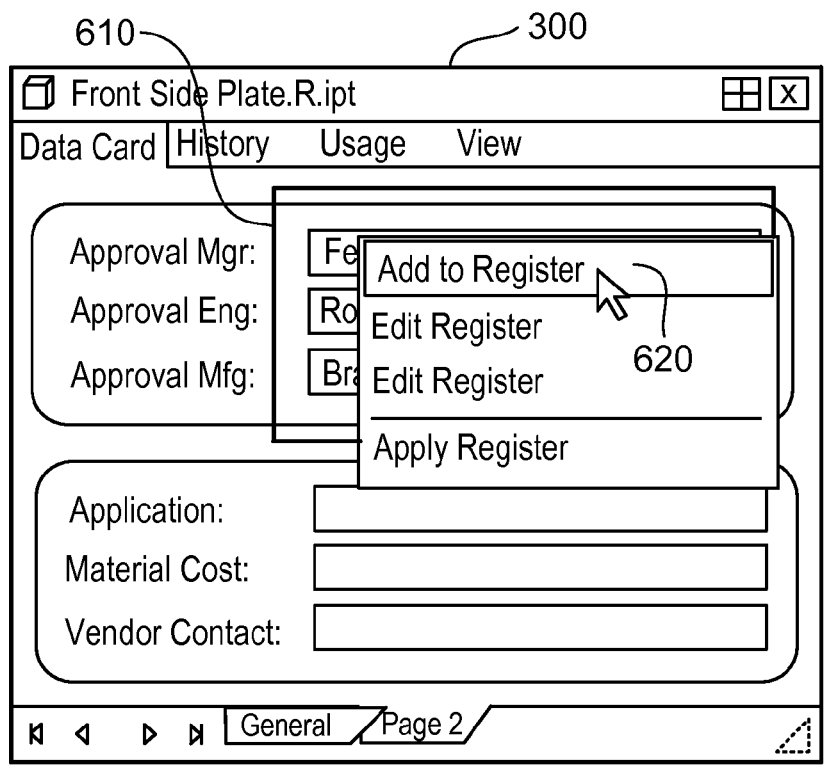
Figure 6C:
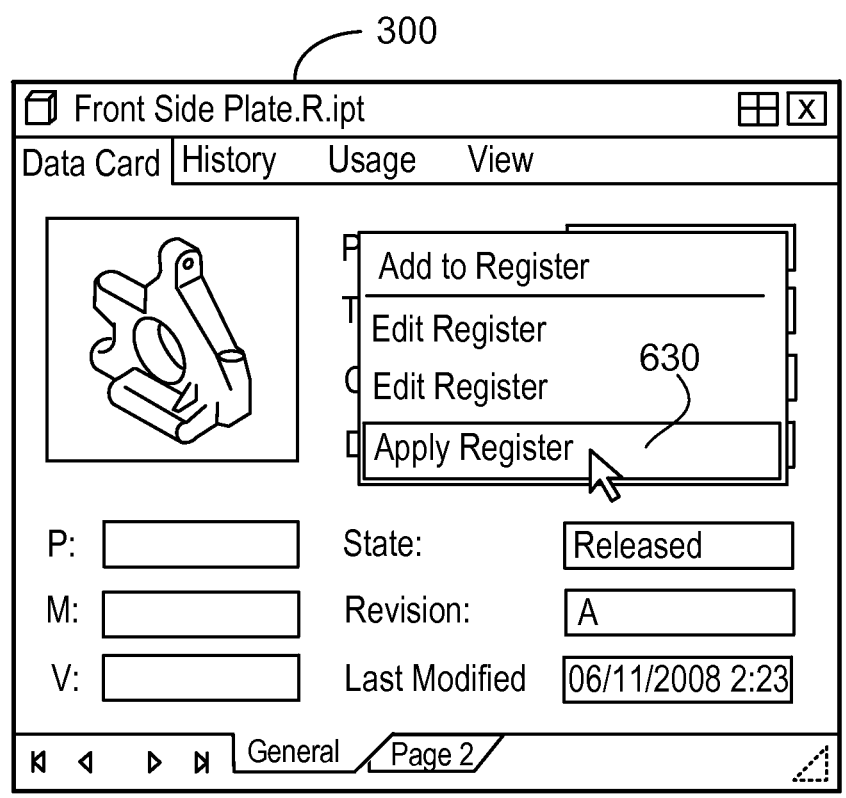

In some examples, property values can be copied from a first component data card and applied to a second component data card without the need to retype the values. The target property fields are selected, for example, by drawing a selection box 610 around the area of the data card to be copied as illustrated in FIGS. 6A and 6B. In some implementations, multiple selection boxes 610 may be drawn to select property fields from two or more areas of the data card, including separately tabbed areas of the data card. A copy command is invoked, for example, by right clicking within interactive display element 300 and selecting the copy command 620 (e.g., "Add to Register" as illustrated in FIG. 6B). In response to receiving input indicating the copy command has been invoked, a processing module (e.g., processing module 112) stores the property values associated with the selected property fields, for example, in a program memory. Once stored, a user may apply the property values to a different component by selecting the component to display the corresponding data card. An apply command is invoked, for example, by right clicking within interactive display element 300 and selecting the apply command 630 as illustrated in FIG. 6C. In response to receiving input indicating the apply command has been invoked, a processing module, (e.g., processing module 112) determines which property fields to update based on the stored information and updates the appropriate property fields with the corresponding stored property values. Thus, property values may be copied from one component data card to another while avoiding the costly risk associated with typing mistakes.

Figure 7A:
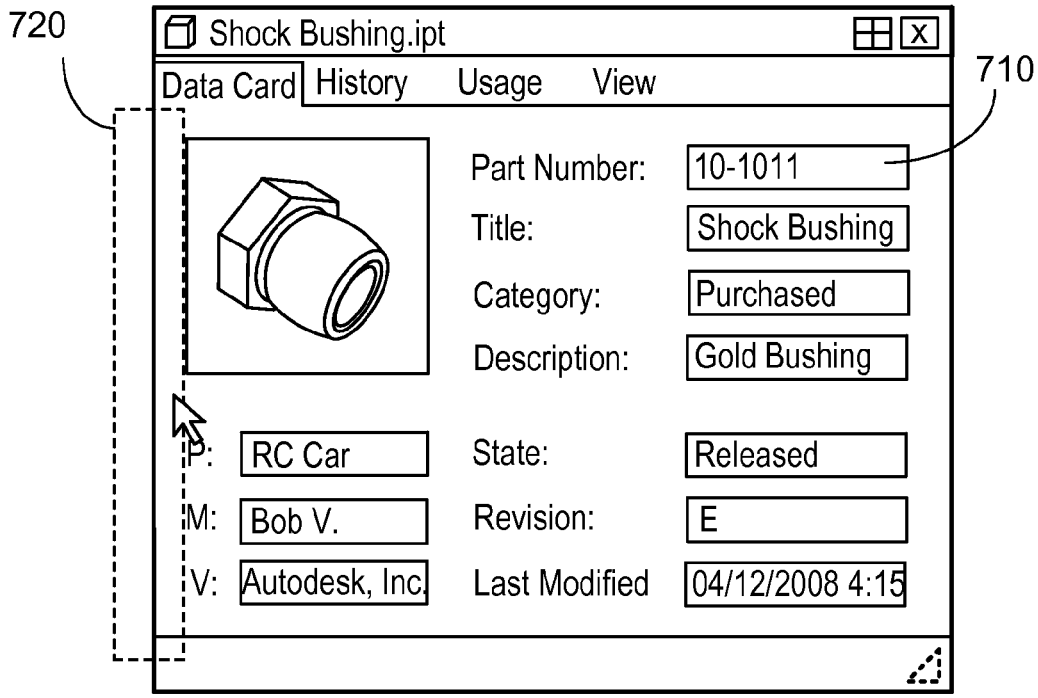
FIGS. 7A, 7B, and 7C illustrate an animated sequence for activating a revision slide bar.
Figure 7B:
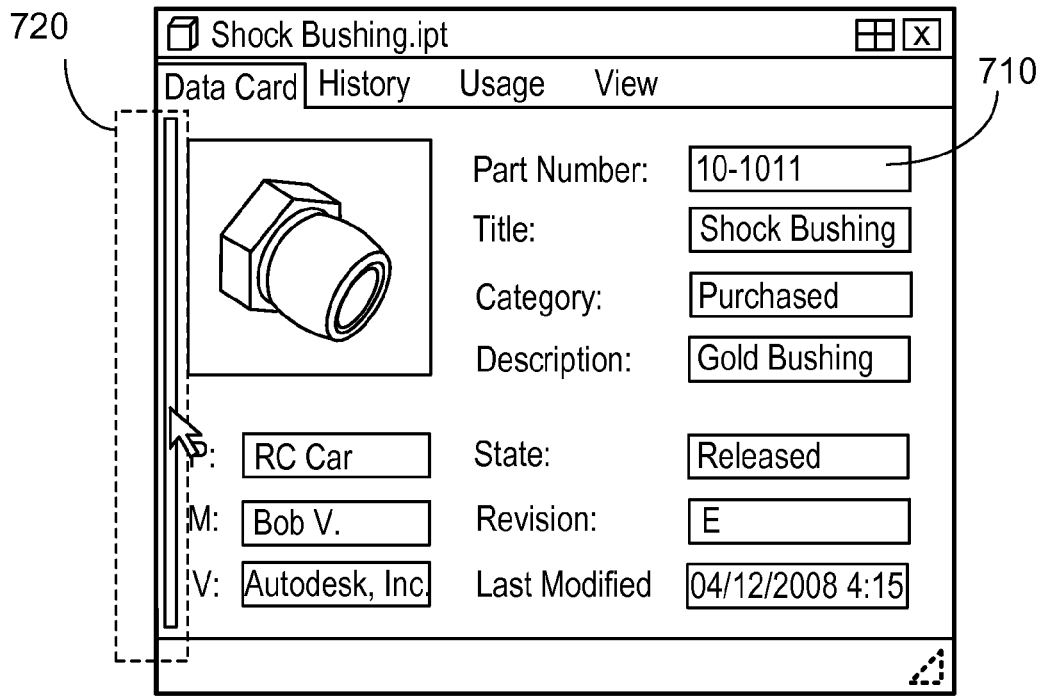
Figure 7C:
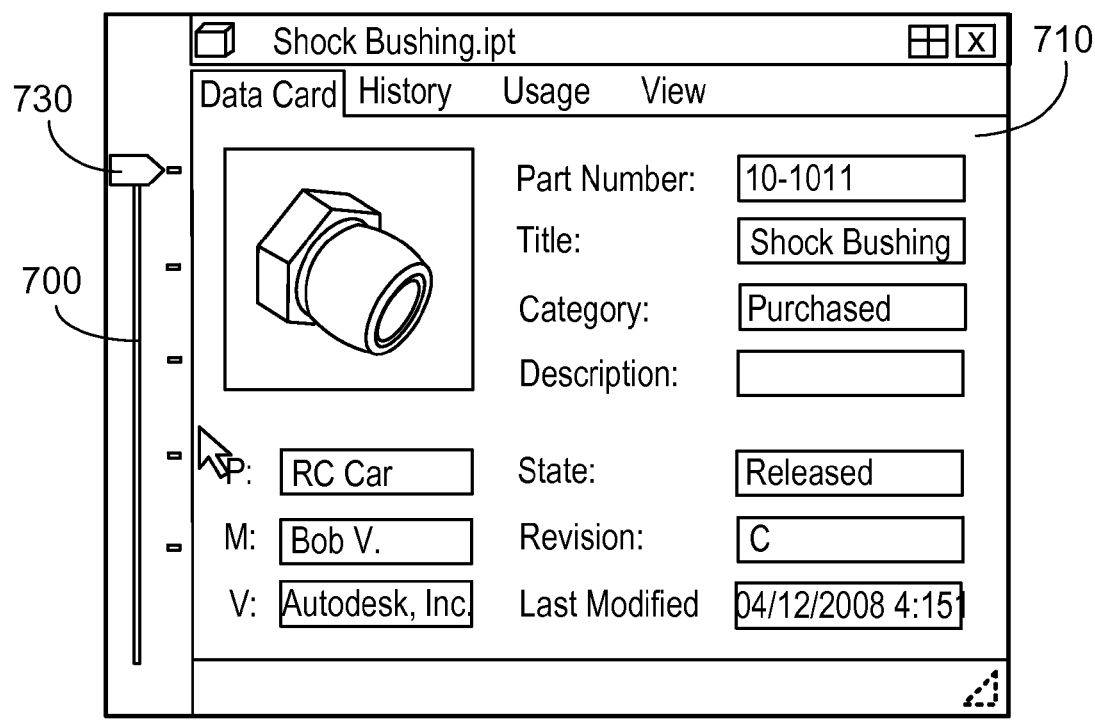
Figure 8A:
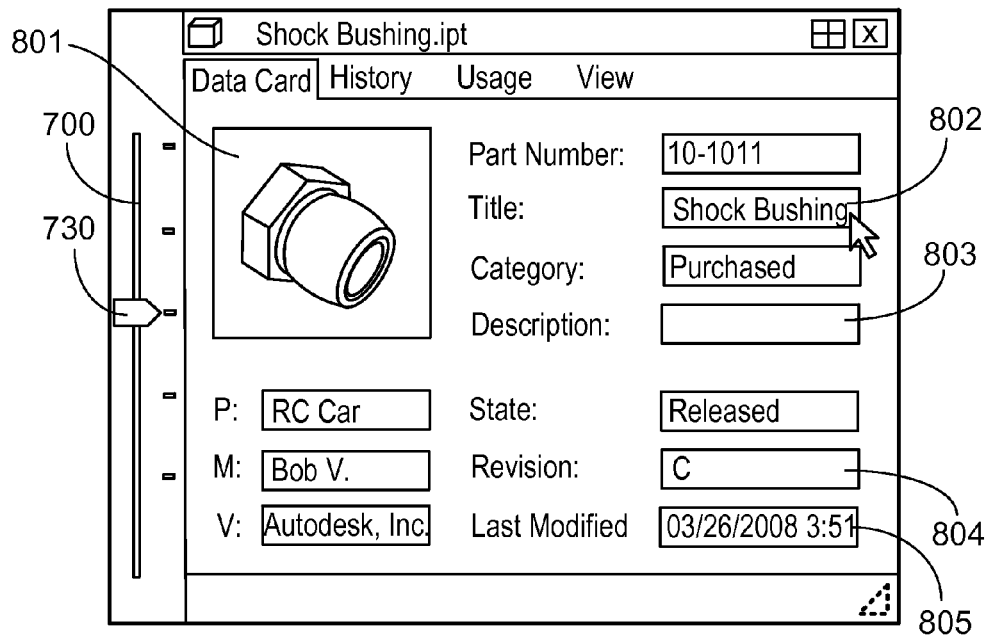
FIG. 8A illustrates an exemplar data card displaying a revision history for a selected component.

As described above, components may undergo numerous design changes or revisions during product development. Thus, another aspect of this disclosure relates to enabling the presentation of a revision history within GUI 111. Design changes are stored in a revision history of the object and are accessible via interactive display element 300 by activating revision slide bar 700. In some implementations, revision slide bar 700 is hidden from view until activated by placing the mouse pointer or cursor over a particular area 720 of data card 710, for example, an edge of the data card. Revision slide bar 700 is similarly deactivated/hidden by placing the mouse pointer or cursor over the same area 720 of data card 710. FIGS. 7A-7C illustrate an animated sequence for activating revision slide bar 700. Revision slide bar 700 enables a user to examine older revisions of the component by manipulating the position of scroll pointer 730. After receiving input indicating selection of an older revision of a component, a processing module (e.g., processing module 112) determines the property values associated with the selected revision and provides the property values for presentation in GUI 111. In some implementations, property values differing from the latest revision are indicated by highlighting the property field and/or text. For example, FIG. 8A illustrates a previous revision (i.e., Revision C) of the shock bushing illustrated in FIG. 7C (Revision E). As indicated by the highlighting of the thumbnail image 801, Title 802, Description 803, Revision 804, and Last Modified fields 805, the corresponding property values in the latest revision differ from those presented in revision C.

Figure 8B:
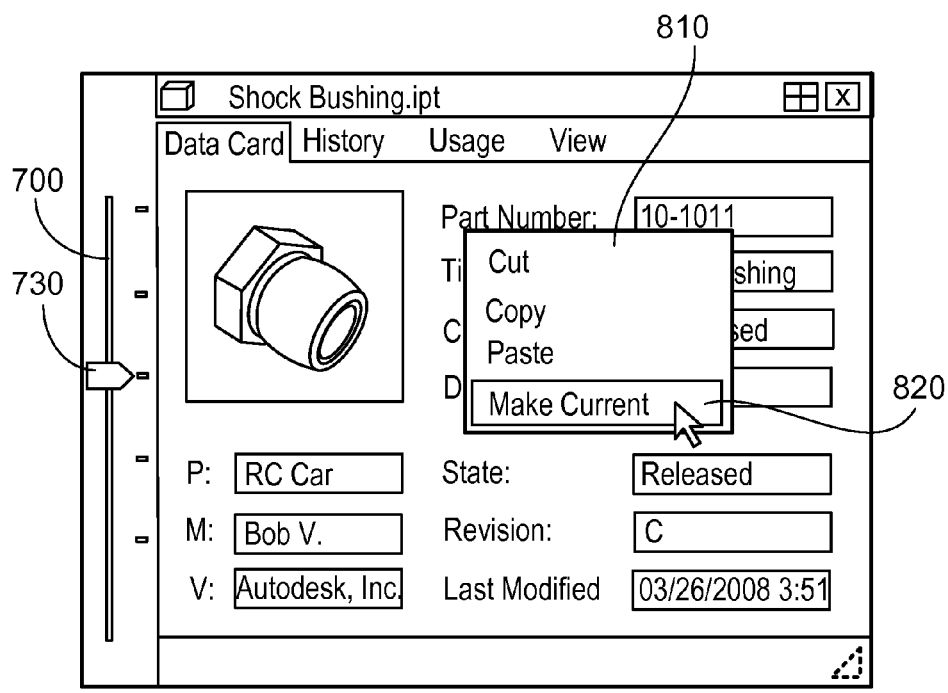
FIG. 8B illustrates an exemplar technique for updating property information in a current revision to match a previous revision.

In further implementations, a property value associated with an earlier revision of a component may be applied to the latest revision of the component by selecting the corresponding property field and invoking a command to make the property value current, such as the "Make Current" command 820 illustrated in FIG. 8B. The property field is selected, for example, by right clicking within the corresponding area of the data card. In response to input indicating selection of a property field having a value different from the current revision, a command menu 810 is presented in GUI 111 by interactive display element 300. A user may then select the "Make Current" command 820 from the command menu. After receiving input indicating selection of a property field to be applied to the latest revision, a processing module (e.g., processing module 112) updates the property value associated with the latest revision and provides the property value for presentation in GUI 111. In some implementations, the selected property value is also applied to each of the intermediate revisions (i.e., Revision D in this example).

Figure 9:
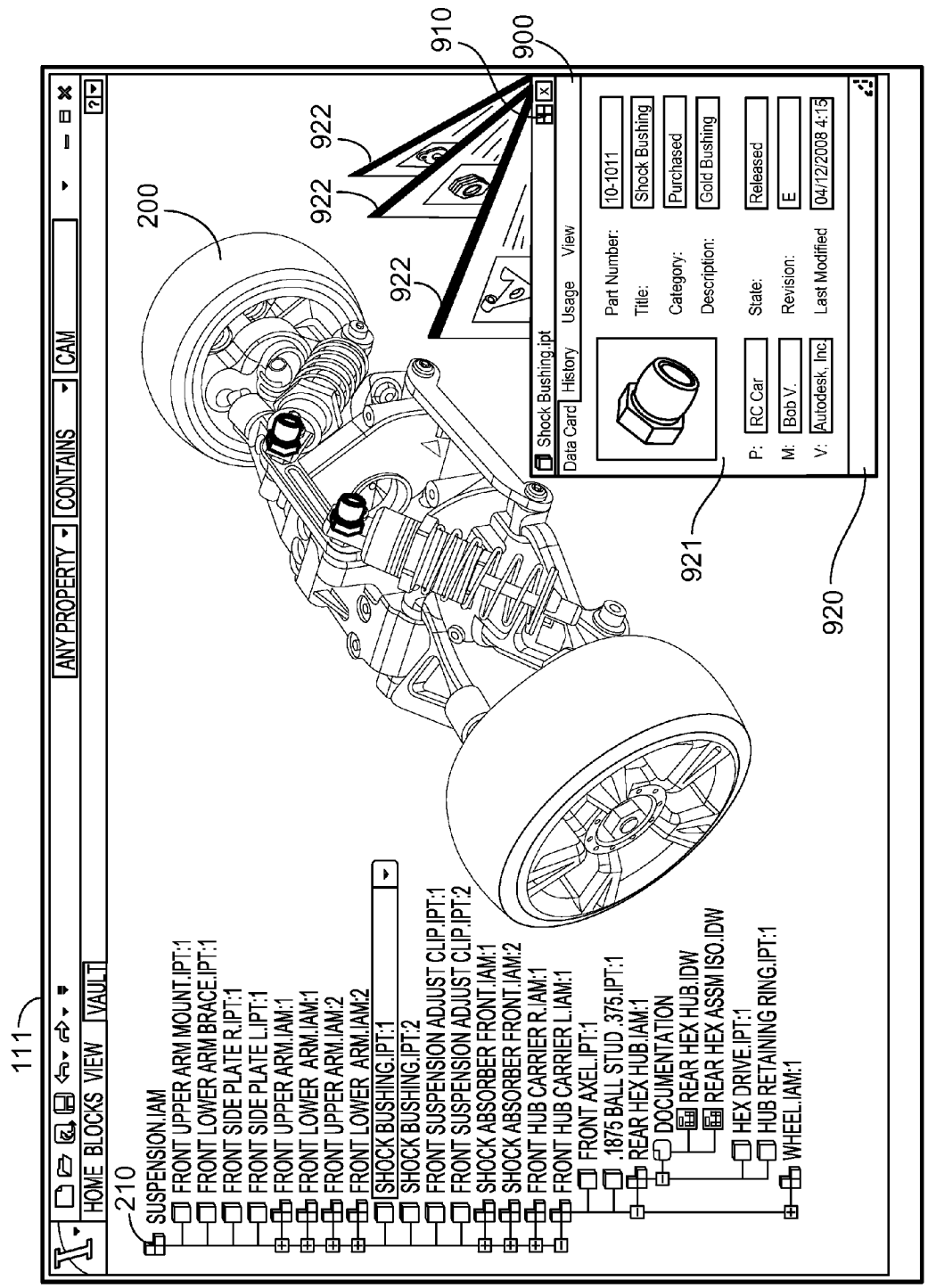
FIG. 9 illustrates an exemplar interactive display element operable to select a display mode.

A further aspect of this disclosure relates to enabling quick identification of a component in model 200 and providing techniques for navigating between multiple data cards. FIG. 9 illustrates an exemplar interactive display element 900 operable to select an isolation display mode in which the selected component is highlighted in model 200 and a radial display mode in which data cards for multiple components are presented simultaneously in GUI 111.

The isolation display mode is selected, for example, by invoking a command or activating a display mode button 910 in interactive display element 300. Highlighting of the selected component in model 200 is accomplished by presenting non-selected components in a semi-transparent or transparent manner such that only the selected component has an opaque appearance. Other implementations accomplish the highlighting of the selected component in other ways, including, for example, presenting non-selected components in gray scale or black and white and the selected component in color, accentuating the features of the selected component by using thicker lines and/or thinner lines on non-selected components, etc.

In further implementations, selection of the radial display mode causes multiple data cards to be presented simultaneously in GUI 111. In response to receiving input indicating selection of the display mode, a processing module (e.g., processing module 112) determines a set of property values for each of one or more additional components and provides at least a portion of the determined property values for presentation in GUI 111. As illustrated in FIG. 9, a data card deck 920 is presented in a radial or fanned-out display format including a data card 921 in the foreground (i.e., the active or currently selected component) and additional data cards 922 in the background. Additional components may be selected as described above with respect to selecting multiple components and/or in response to a search or query, as described below. After receiving a selection of one or more additional components, the processing module determines the corresponding property values and provides at least a portion of the determined property values for presentation in GUI 111 as separately displayed data cards. A user may flip forward and/or backward through data card deck 920 selecting a different active component from the displayed components such that the selected component's data card appears in the foreground as the active component. The selection is made, for example, by using keyboard arrow keys and/or quick and deliberate mouse strokes indicating the direction in which to flip through data card deck 920.

In some implementations, features of the isolation display mode and the radial display mode are combined in a single display mode such that multiple data cards are presented simultaneously in GUI 111 and such that selecting a data card for display in the foreground, as described above, also highlights the corresponding component in model 200 and/or browser 210.

The selected display mode is deactivated, for example, by invoking a command or selecting/deactivating the display mode button 910 in interactive display element 900. In some implementations, the selected display mode is temporarily deactivated by moving the mouse pointer or cursor outside the data card area. Moving the mouse pointer or cursor into the data card area reactivates the selected display mode.

Figure 10A:
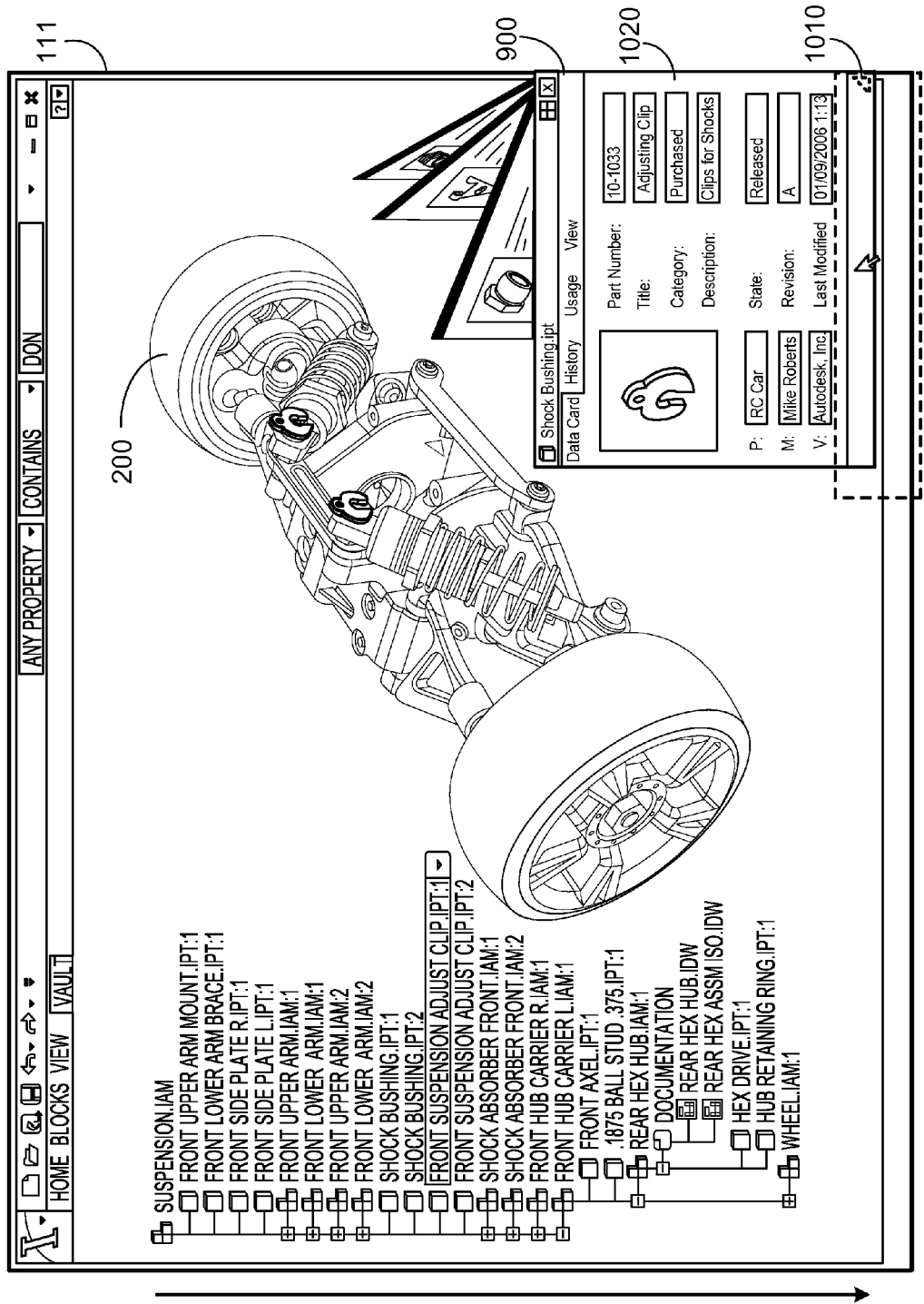
FIGS. 10A-10C illustrate an animated sequence for activating a search field.
Figure 10B:
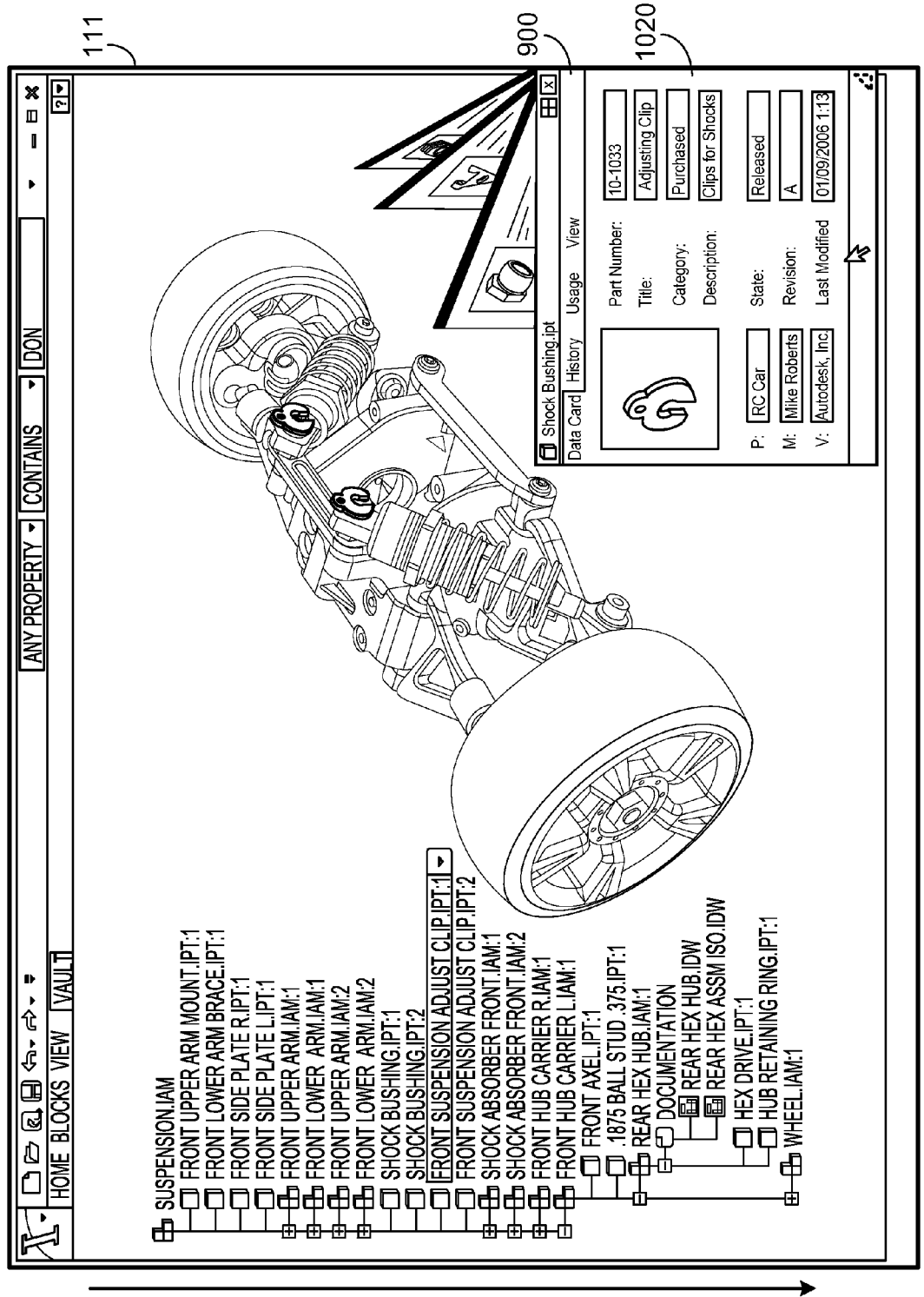
Figure 10C:
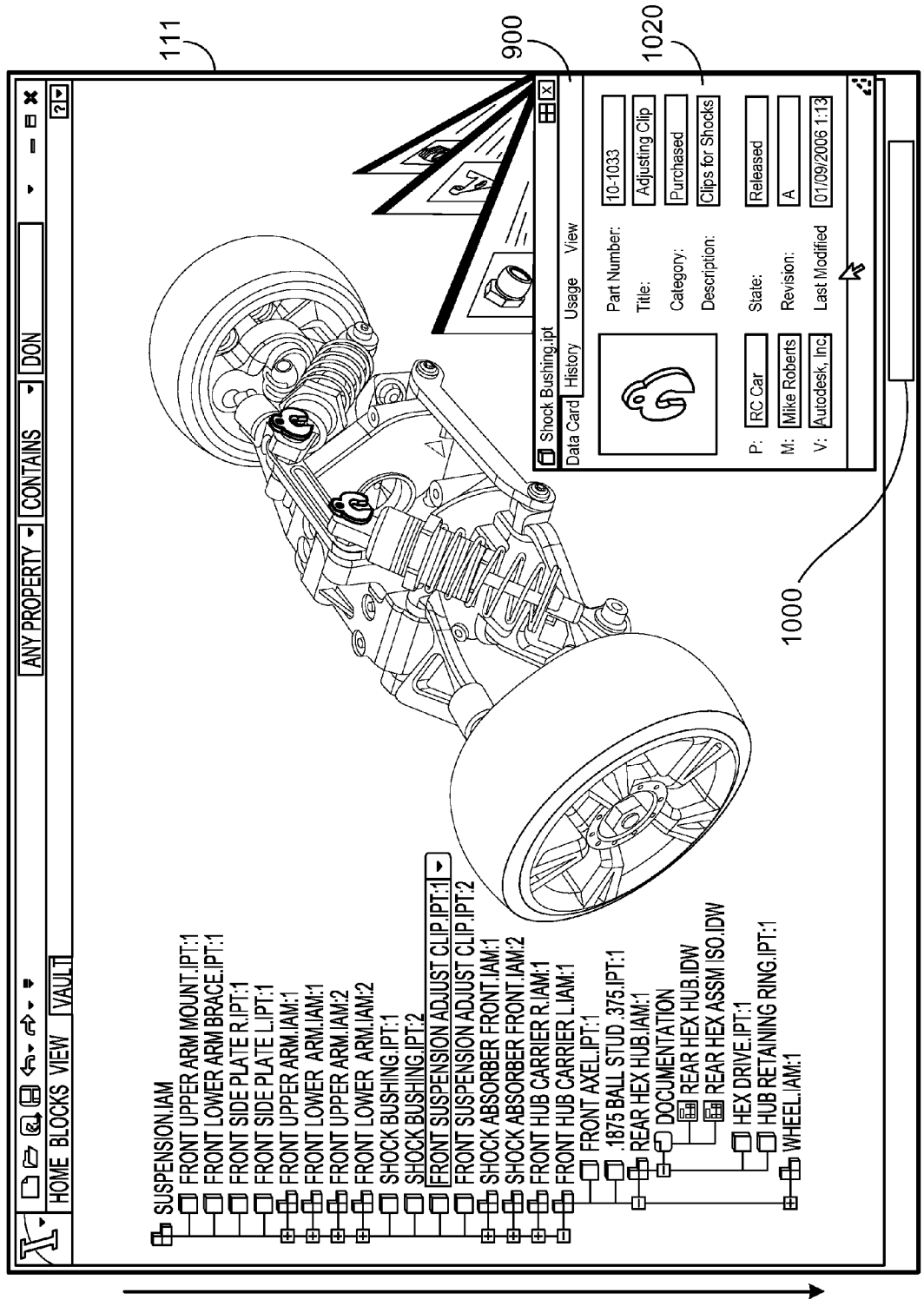

Another aspect of this disclosure relates to providing a search or query function to quickly identify and/or select components based on user specified search criteria. The search feature is accessible via a search field 1000 in interactive display element 900. In some implementations, search field 1000 is hidden from view until activated by placing the mouse pointer or cursor over a particular area 1010 of data card 1020, for example, a bottom edge of the data card. FIGS. 10A-10C illustrate an animated sequence for activating search field 1000. Search field 1000 is deactivated/hidden by placing the mouse pointer or cursor over the same area 1010 of data card 1020. Search field 1000 enables a user to search property values associated with the components included in model 200 using user specified search criteria, for example, a text string. If the radial display mode or combined display mode is active, the data cards corresponding to the components identified in the search results are displayed simultaneously in GUI 111. Presenting the search results in the radial or combined display mode also enables the user to quickly and easily flip through the search results using the techniques described above. As the number of components identified in the search results is reduced by modifying/narrowing the search criteria, the number of data cards displayed is also reduced.

Figure 11:
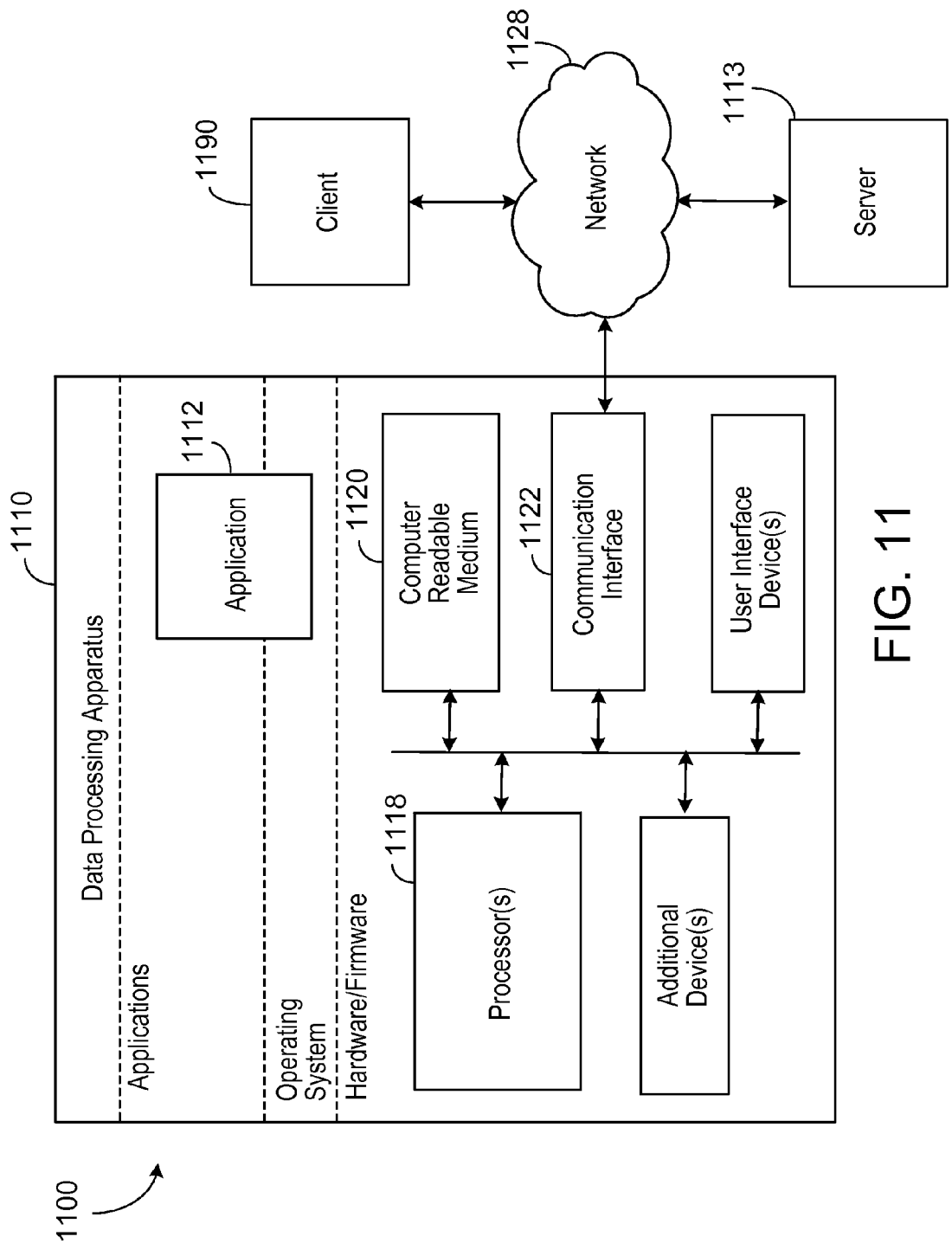
FIG. 11 illustrates an exemplar system configured to perform the techniques described herein.

FIG. 11 illustrates an example system 1100 configured to present property information associated with a selected component 211 in the context of model 200 and browser 210, enable quick identification of a component in model 200, implement the techniques described above for presenting and navigating between multiple data cards, enable the presentation of a revision history within GUI 111, and provide a search or query function to quickly identify and/or select components based on user specified search criteria. A data processing apparatus 1110 includes hardware/firmware, an operating system and one or more applications or application modules, including an application 1112. The application 1112 can be, for example, a CAD program. As used within this specification, the term "application" refers to a computer program that the user perceives as a distinct computer tool used for a defined purpose. The application 1112 can be built entirely into the operating system (OS) of the data processing apparatus 1110, or the application 1112 can have different components located in different locations (e.g., one portion in the OS or kernel mode, one portion in the user mode, and one portion in a remote server, such as server 1113), and the application 1112 can be built on a runtime library serving as a software platform of the apparatus 1110. Moreover, the application 1112 can be a GUI application (e.g., a Web browser) that connects to one or more processors 1118 (e.g., one or more Web servers) over a network 1128 and provides functionality, such as CAD functionality, as a network service. In various implementations, the application 1112 can be a recipient application that can receive one or more user inputs corresponding to window movement. The application 1112 includes machine-readable instructions that, when executed, present a representation of one or more application objects to be displayed on the data processing apparatus 1110.

The data processing apparatus 1110 includes one or more processors 1118 and at least one computer-readable medium 1120. The at least one computer-readable medium 1120 can include a random access memory (RAM) a program memory (for example, a writable read-only memory (ROM) such as a flash ROM), a hard drive, and a removable disk drive (e.g., a floppy disk, compact disk (CD), or digital versatile disk (DVD) drive). All such computer-readable media can be suitable for storing executable or interpretable computer programs, including programs or application components embodying aspects of the subject matter described in this specification. In addition, the data processing apparatus 410 can include a hard drive controller, a video controller, and an input/output (I/O) controller coupled by a system bus. The apparatus 1110 can be preprogrammed, in ROM, for example, or it can be programmed (and reprogrammed) by loading a program from another source (for example, from a floppy disk, a CD-ROM, DVD, or another computer).

The data processing apparatus 1110 can also include one or more input/output (I/O) interface devices, such as a wireless and/or wired communication interface 1122. The data processing apparatus can communicate with one or more clients 1190 or servers 1113 using the communication interface 1122 over network 1128 according to the type of communication implemented by the network 1128. For example, the communication interface 1122 can communicate using a wireless Bluetooth session, a wired USB session, a TCP/IP session (both wireless and wired), a wireless infra-red (IR) session, or other communication sessions using the appropriate network. That is, network 1128 may be a Bluetooth network, a USB network, TCP/IP network, an IR network, or a variety of other types of networks. Once programmed as described in this specification, the data processing apparatus 1110 is operable to provide window movement functionality using any of the techniques described in this specification.

Various implementations of the systems and techniques described in this specification can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used in this specification, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor.

To provide for interaction with a user, the systems and techniques described here can be implemented on a computer having a display device (e.g., a CRT (cathode ray tube)

or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back-end component (e.g., as a data server), or that includes a middleware component (e.g., an application server), or that includes a front-end component (e.g., a client computer having a graphical user interface or a Web browser through which a user can interact with an implementation of the systems and techniques described here), or any combination of such back-end, middleware, or front-end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments of the subject matter have been described. Nevertheless, it will be understood that various modifications may be made without departing from the spirit and scope of the invention. For example, various forms of the flows shown above may be used, with steps re-ordered, added, or removed. Also, although several applications of the payment systems and methods have been described, it should be recognized that numerous other applications are contemplated. Accordingly, other embodiments are within the scope of the following claims.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A computer-implemented method, comprising:
providing an interactive display element in a graphical user interface (GUI) of a computer aided design tool wherein the interactive display element has an arrangement of property fields related to a selected component, and wherein the interactive display element is resizable and repositionable in the GUI so as to enable simultaneous viewing of a given selected component in a model along with the interactive display element including arrangement of property fields;

receiving a selection of a component of a model presented in the GUI;

determining current property values associated with the property fields based on the selected component;

providing the determined current property values in corresponding property fields of the interactive display element for presentation in the GUI in conjunction with the model including providing the determined current property values in the interactive display element, wherein providing the determined current property values comprises providing a thumbnail image of the component in an image field for presentation in the GUI and positioning and sizing the interactive display element for simultaneous viewing of the interactive display element including the determined current property values and the selected component of the model, wherein the selected component is highlighted in a view at its respective location in the model, and wherein the interactive display element is operable to access a revision history of the selected component; and responsive to receiving input through the interactive display element, the input indicating selection of a revision of the selected component,
determining one or more different prior property values associated with the property fields based on the revision of the selected component obtained from the revision history, and
providing the determined one or more different prior property values in one or more corresponding property fields of the interactive display element for presentation in the GUI in conjunction with the model including highlighting the determined one or more different prior property values in the interactive display element.

2. The method of claim 1 further comprising:
receiving a replacement property value for a selected property field in the interactive display element; and
updating a same property value for the component based on the replacement property value.

3. The method of claim 2, wherein the interactive display element comprises a slide bar operable to obtain the input indicating selection of the revision of the selected component.

4. The method of claim 1, wherein the interactive display element is operable to select a display mode, the method further comprising:
receiving input indicating selection of a first display mode of the interactive display element; and responsive to the input,
providing information related to one or more additional components for presentation in the GUI with the model.

5. The method of claim 4, wherein providing information comprises determining a set of property values for each of the one or more additional components and providing at least a portion of each set of property values.

6. The method of claim 5, wherein the arrangement of property fields is a data card arrangement and wherein providing information comprises providing the information for presentation in the GUI as one or more additional data cards corresponding to the one or more additional components, wherein the portion of each set of property values is displayed.

7. The method of claim 4, the method further comprising receiving a selection of the one or more additional components.

8. The method of claim 4, wherein the interactive display element comprises a foreground display element for presenting property values associated with an active component chosen from the selected component and the one or more additional components.

9. The method of claim 8, the method further comprising:
receiving input from the interactive display element indicating selection of a different active component; and responsive to the input,
providing property values associated with the different active component for presentation in the foreground display element.

10. The method of claim 9, wherein the selected component and the one or more additional components are presented in a circular list and the input indicating selection of the different active component further indicates whether the different active component selected is before or after the active component in the circular list.

11. A non-transitory computer program product tangibly embodied in a computer-readable storage device, the computer program product including instructions operable to cause one or more data processing apparatus to perform operations comprising:
receiving selection of a component of a model presented in a graphical user interface (GUI) of a computer aided design tool, the GUI comprising an interactive display element having an arrangement of property fields related to the selected component wherein the interactive display element is resizable and repositionable in the GUI so as to enable simultaneous viewing of the selected component in the model along with the interactive display element including the arrangement of the property fields;
determining current property values associated with the property fields based on the selected component;
providing the determined current property values in corresponding property fields of the interactive display element for presentation in the GUI in conjunction with the model including providing the determined current property values in the interactive display element, wherein providing the determined current property values comprises providing a thumbnail image of the selected component in an image field for presentation in the GUI and positioning and sizing the interactive display element for simultaneous viewing of the interactive display element including the determined current property values and the selected component of the model, wherein the selected component is highlighted in a view at its respective location in the model, and wherein the interactive display element is operable to access a revision history of the selected component; and
responsive to receiving input through the interactive display element, the input indicating selection of a revision of the selected component,
determining one or more different prior property values associated with the property fields based on the revision of the selected component obtained from the revision history, and
providing the determined one or more different prior property values in one or more corresponding property fields of the interactive display element for presentation in the GUI in conjunction with the model including highlighting the determined one or more different prior property values in the interactive display element.

12. The program product of claim 11, wherein the interactive display element is operable to select a display mode, the operations further comprising:
receiving input indicating selection of a first display mode of the interactive display element; and responsive to the input,
providing information related to one or more additional components for presentation in the GUI with the model.

13. The program product of claim 12, wherein providing information comprises determining a set of property values for each of the one or more additional components and providing at least a portion of each set of property values.

14. The program product of claim 13, wherein the arrangement of property fields is a data card arrangement and wherein providing information comprises providing the information for presentation in the GUI as one or more additional data cards corresponding to the one or more additional components, wherein the portion of each set of property values is displayed.

15. The program product of claim 12, the operations further comprising receiving a selection of the one or more additional components.

16. The program product of claim 12, wherein the interactive display element comprises a foreground display element for presenting property values associated with an active component chosen from the selected component and the one or more additional components.

17. The program product of claim 16, the operations further comprising:
receiving input from the interactive display element indicating selection of a different active component; and responsive to the input,
providing property values associated with the different active component for presentation in the foreground display element.

18. The program product of claim 17, wherein the selected component and the one or more additional components are presented in a circular list and the input indicating selection of the different active component further indicates whether the different active component selected is before or after the active component in the circular list.

19. A system comprising:
a computer-readable storage device including instructions; and
one or more data processing apparatus, comprising one or more processors, operable to execute the instructions and perform operations comprising:
receiving selection of a component of a model presented in a graphical user interface (GUI) of a computer aided design tool, the GUI comprising an interactive display element having an arrangement of property fields related to the selected component wherein the interactive display element is resizable and repositionable in the GUI so as to enable simultaneous viewing of the selected component in the model along with the interactive display element including the arrangement of the property fields;
determining current property values associated with the property fields based on the selected component;
providing the determined current property values in corresponding property fields of the interactive display element for presentation in the GUI in conjunction with the model including providing the determined current property values in the interactive display element, wherein providing the determined current property values comprises providing a thumbnail image of the selected component in an image field for presentation in the GUI and positioning and sizing the interactive display element for simultaneous viewing of the interactive display element including the determined current property values and the selected component of the model, wherein the selected component is highlighted in a view at its respective location in the model, and wherein the interactive display element is operable to access a revision history of the selected component; and responsive to receiving input through the interactive display element, the input indicating selection of a revision of the selected component,
- determining one or more different prior property values associated with the property fields based on the revision of the selected component obtained from the revision history, and
- providing the determined one or more different prior property values in one or more corresponding property fields of the interactive display element for presentation in the GUI in conjunction with the model including highlighting the determined one or more different prior property values in the interactive display element.

* * * * *